(12) United States Patent
Zhang et al.

(10) Patent No.: US 8,784,054 B2
(45) Date of Patent: Jul. 22, 2014

(54) FAN MODULE

(75) Inventors: Guang-Yi Zhang, Shenzhen (CN);
Jia-Qi Fu, Shenzhen (CN); Wei Qiu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 501 days.

(21) Appl. No.: 13/095,887

(22) Filed: Apr. 28, 2011

(65) Prior Publication Data
US 2012/0168001 A1 Jul. 5, 2012

(30) Foreign Application Priority Data

Dec. 30, 2010 (CN) .......................... 2010 1 0614827

(51) Int. Cl.
*H05K 7/20* (2006.01)
*F04D 29/64* (2006.01)

(52) U.S. Cl.
USPC ...................................... 415/213.1

(58) Field of Classification Search
USPC ......... 361/695; 416/244 R; 415/213.1, 214.1, 415/119, 220, 232
See application file for complete search history.

(56) References Cited

U.S. PATENT DOCUMENTS

| 5,806,140 A * | 9/1998 | Carlson et al. ................... 16/2.1 |
| 8,282,345 B2 * | 10/2012 | Fan et al. ...................... 415/119 |
| 2011/0158791 A1 * | 6/2011 | Li ................................. 415/119 |

* cited by examiner

*Primary Examiner* — Nathaniel Wiehe
*Assistant Examiner* — Brian O Peters
(74) *Attorney, Agent, or Firm* — Novak Druce Connolly Bove + Quigg LLP

(57) ABSTRACT

A fan module includes a receiving rack, a number of mounting members, a number of fans, and a number of fastening members. The receiving rack includes two side plates and a number of receiving spaces between the side plates. A top side of each side plate corresponding to one receiving space defines two cutouts. Each mounting member is latched in one corresponding cutout of the receiving rack. Each fan is received in one corresponding receiving space of the receiving rack. The fastening members are arranged on the fans and are latched in the mounting members.

16 Claims, 6 Drawing Sheets

FAN MODULE

BACKGROUND

1. Technical Field

The present disclosure relates to a fan module.

2. Description of Related Art

With the continuing development of electronic technology, electronic devices, such as computers, generate more heat during operation than previously. The heat needs to be dissipated as quickly as possible. A common method for dissipating the heat is to use fans to generate airflow to dissipate heat from a computer. Usually, the fans are fixed in a mounting device to form a fan module installed in the computer. However, during use, the fan module vibrates and makes noise as the fans operate. Moreover, the vibrations could harm components in the electronic devices.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
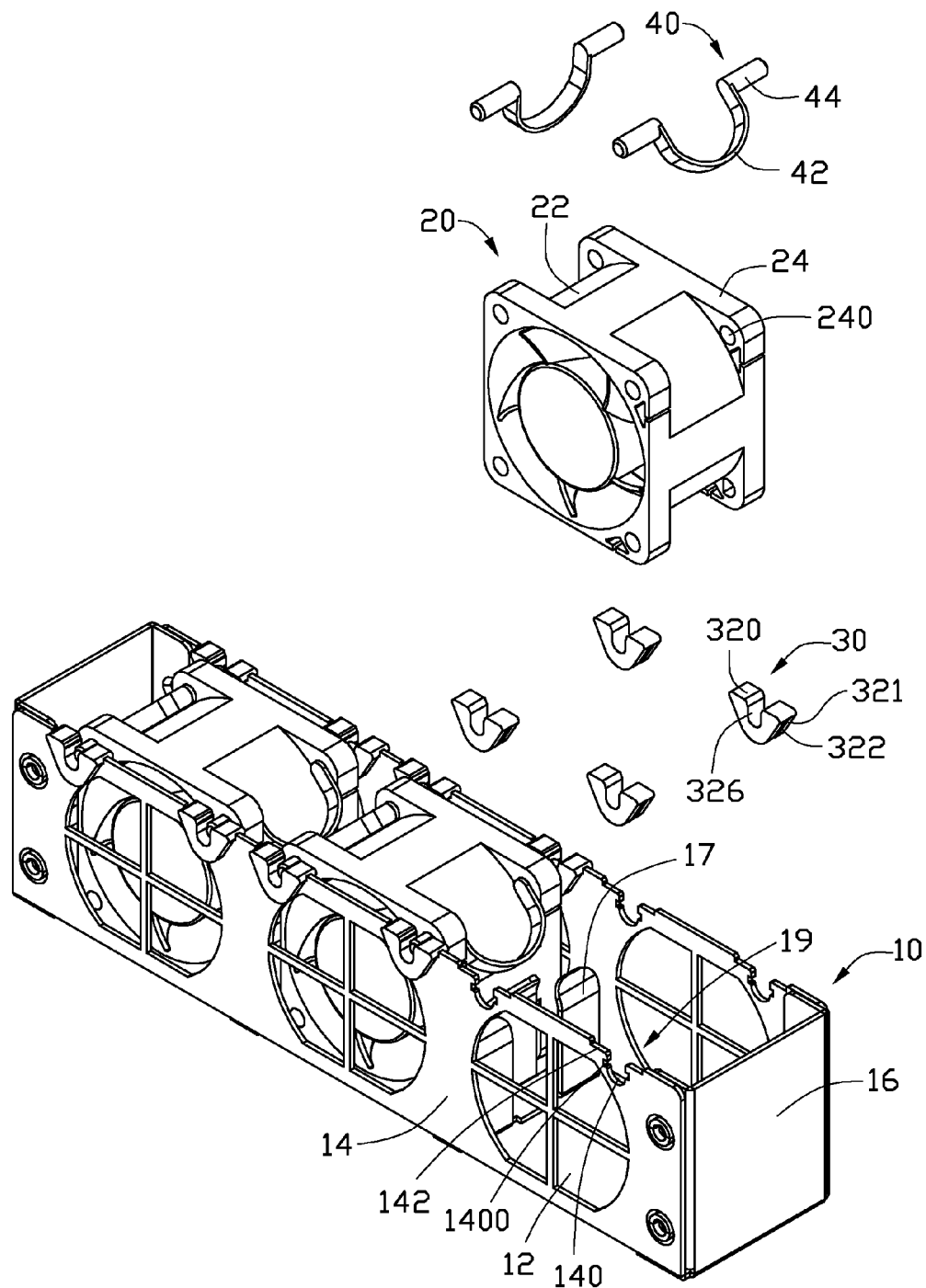
FIG. 1 is an exploded, isometric view of a first exemplary embodiment of a fan module, the fan module includes a plurality of mounting members.
Figure 2:
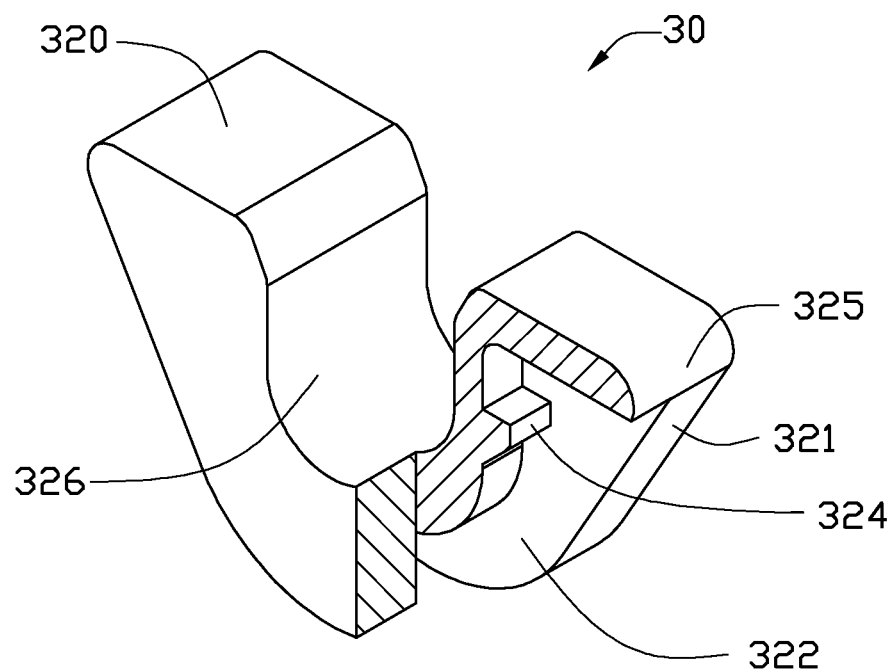
FIG. 2 is an enlarged, cutaway view of one of the mounting member of FIG. 1.

Referring to FIGS. 1 and 2, a first exemplary embodiment of a fan module includes a receiving rack 10, a plurality of fans 20, a plurality of mounting members 30, and a plurality of fastening members 40.

The receiving rack 10 includes a rectangular bottom plate 12, two side plates 14 perpendicularly extending up from opposite sides of the bottom plate 12, two end plates 16 perpendicularly extending up from opposite ends of the bottom plate 12, and a plurality of dividing plates 17 perpendicularly arranged on the bottom plate 12 and parallel to the end plates 16. The receiving rack 10 is divided into a plurality of receiving spaces 19 by the dividing plates 17. A top side of each side plate 14 opposite to the bottom plate 12 defines two substantially C-shaped cutouts 140, corresponding to each receiving space 19. The top side of each side plate 14 also forms two tabs 142 extending from upper portions of opposite sidewalls of each cutout 140. The sidewalls of each cutout 140 define two opposite latching notches 1400, below the corresponding tabs 142.

Each fan 20 includes a main body 22 and two opposite frames 24 formed on opposite ends of the main body 22. Each frame 24 defines four through holes 240 in four corners.

Each mounting member 30 is substantially C-shaped and made of elastic material, such as plastic. The mounting member 30 defines a substantially C-shaped latching slot 326, and includes two top surfaces 320 at opposite sides of the latching slot 326, and a substantially arc-shaped bottom surface 321 connected to ends of the top surfaces 320 opposite to the latching slot 326. Two opposite engaging portions 325 extend from the ends of the top surfaces 320, above the bottom surface 321. The mounting member 30 defines a substantially C-shaped groove 322 in the bottom surface 321. Two protrusions 324 extend from a sidewall of the groove 322, respectively adjacent to the corresponding engaging portions 325.

Each fastening member 40 includes a substantially C-shaped elastic portion 42 and two short shafts 44 extending from opposite ends of the elastic portion 42.

Figure 3:
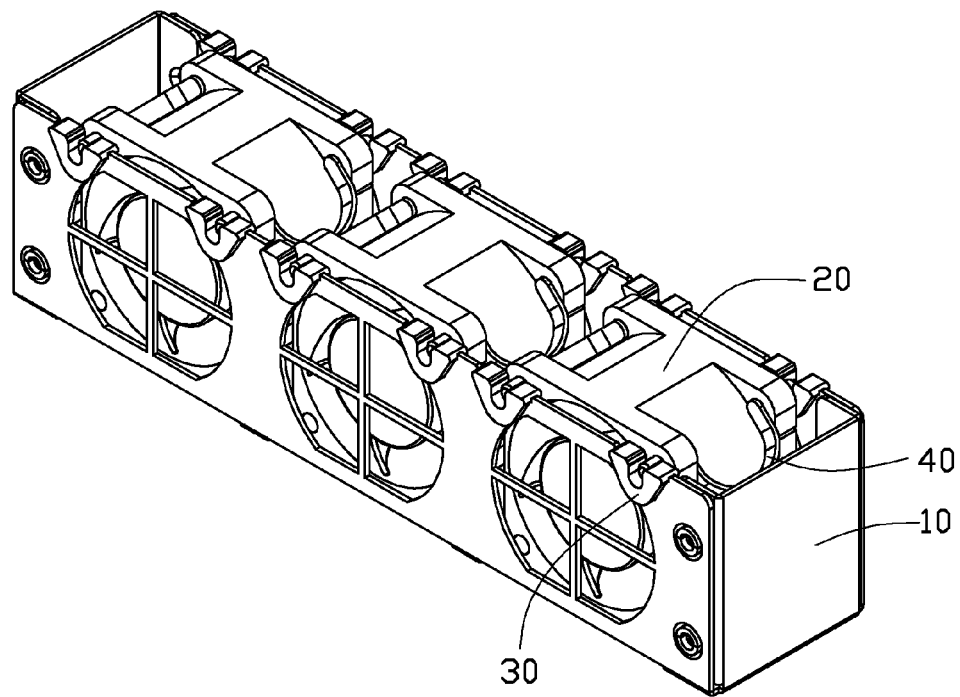
FIG. 3 is an assembled, isometric view of FIG. 1.

Referring to FIG. 3, in assembly, each mounting member 30 is received in a corresponding cutout 140, with the sidewalls of the cutout 140 received in the groove 322 of the mounting member 30. The protrusions 324 of the mounting member 30 are latched in the corresponding latching notches 1400, and the engaging portions 325 of the mounting member 30 are engaged with the corresponding tabs 142. Thus, the mounting member 30 is fastened in the cutout 140. Each fan 20 corresponds to two fastening members 40. The elastic portion 42 of each fastening member 40 is deformed to compress, and the shafts 44 of the fastening member 40 extend through two opposite through holes 240 in the frames 24 of a top of the fan 20. The elastic portion 42 restores and resists against the frames 24 of the fan 20. Therefore, the fastening member 40 is fastened to the fan 20. The fan 20 is received in the corresponding receiving space 19 of the receiving rack 10, with the shafts 44 of the fastening members 40 engaged in the corresponding latching slots 326. Thus, the fastening members 40 are fastened to the receiving rack 10, and the fans 20 are tightly received in the receiving rack 10.

Figure 4:
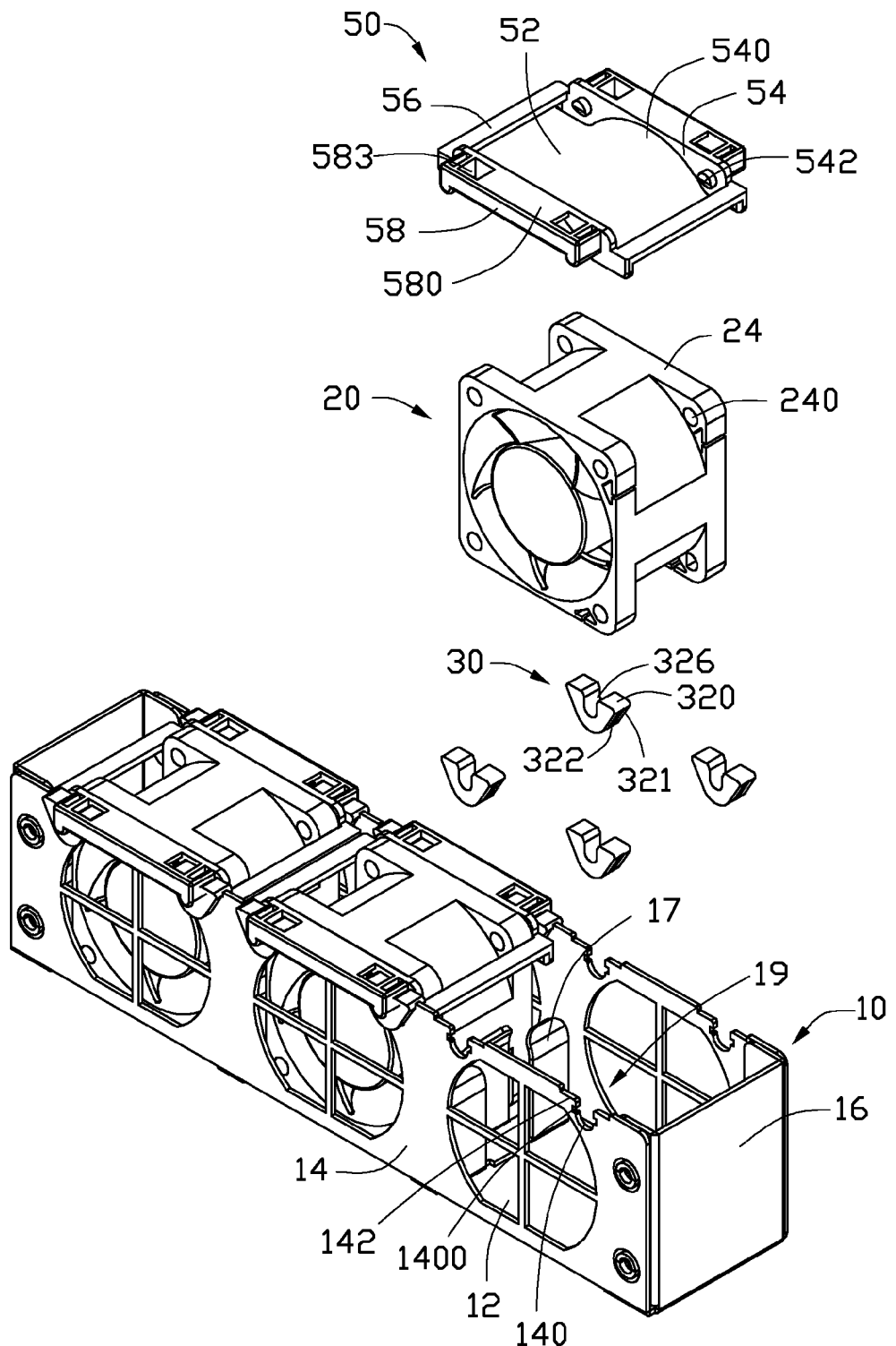
FIG. 4 is an exploded, isometric view of a second exemplary embodiment of a fan module. The fan module includes a plurality of fastening members.
Figure 5:
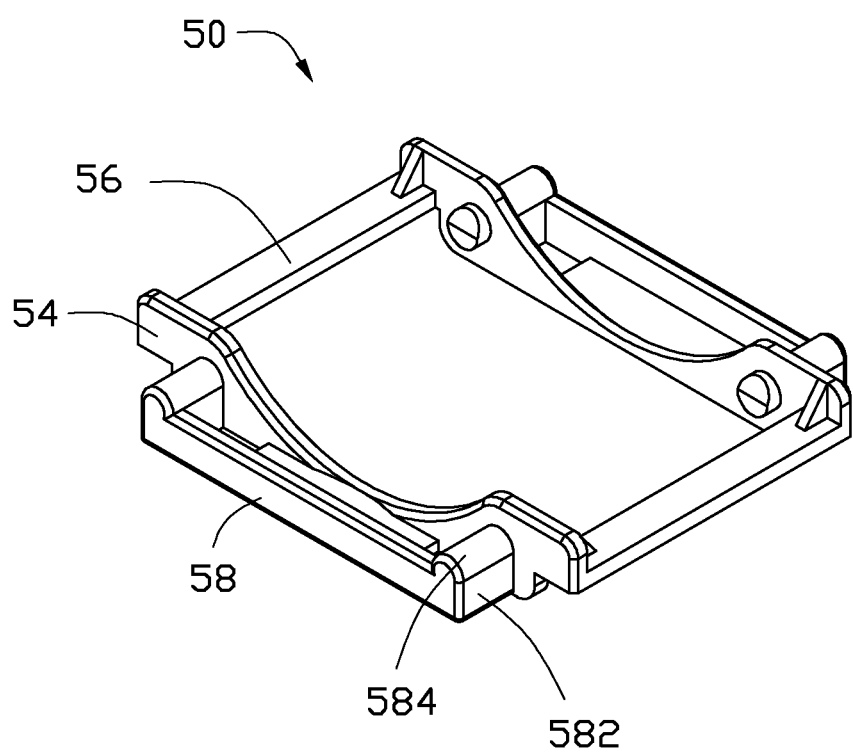
FIG. 5 is an enlarged, inverted view of one of the fastening members of FIG. 4.
Figure 6:
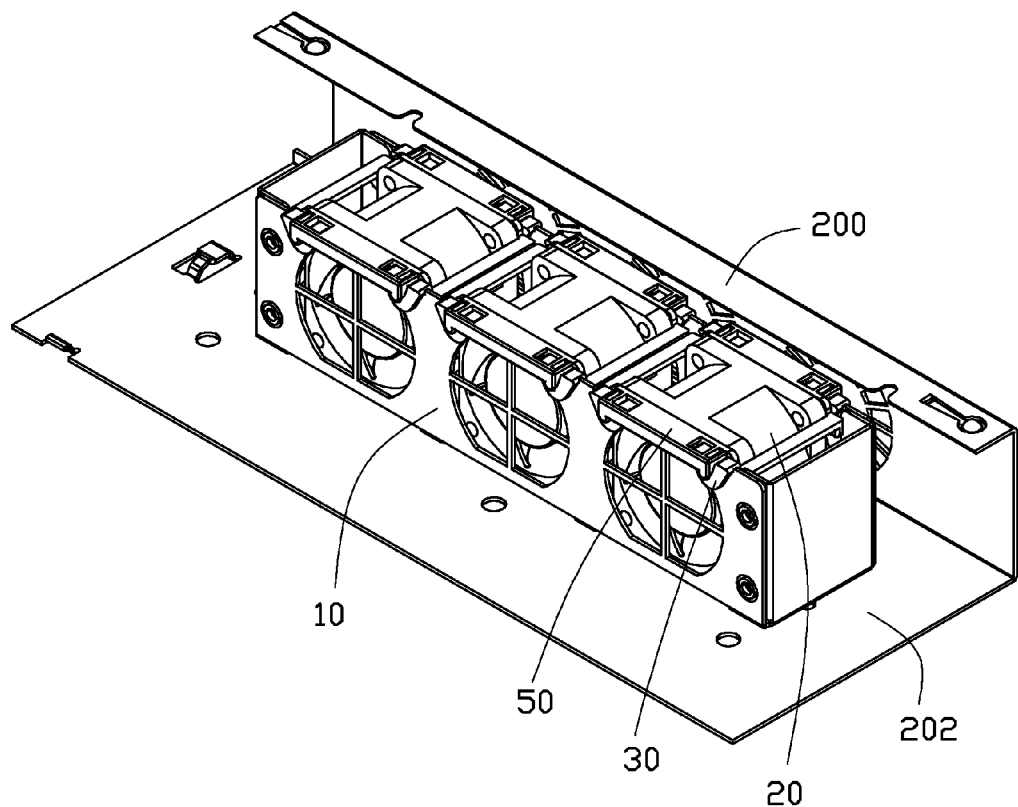
FIG. 6 is an assembled, isometric view of FIG. 4 and an electronic device.

Referring to FIGS. 4 to 6, a second exemplary embodiment of a fan module includes all components of the first embodiment of the fan module, except it uses a fastening member 50 that replaces every two fastening members 40.

Each fastening member 50 includes two opposite first pieces 54 and two opposite second pieces 56 substantially perpendicularly connected between corresponding ends of the first pieces 54. The first pieces 54 and the second pieces 46 together bind an opening 52. A bottom side of each first piece 54 defines an arch 540. A latching portion 58 extends from an outer surface of each first piece 54. Two shafts 542 extend from opposite ends of an inner surface of each first piece 54. An extremity of each shaft 542 is substantially wedge-shaped. The latching portion 58 includes a top sheet 580 extending from the outer surface of the corresponding first piece 54. Two opposite latching blocks 582 substantially perpendicularly extending from opposite ends of the top sheet 580 connected to the outer surface of the first piece 52. In addition, two substantially semi-column-shaped protrusions 584 extending from bottoms of the corresponding latching blocks 582. The top sheet 580 defines two spaced through holes 583 therein.

In assembly, the mounting members 30 are fastened to the receiving rack 10 following the first embodiment of the fan module. A top of each fan 20 extends through the opening 52 of the corresponding fastening member 50. The shafts 542 are received in the four through holes 240 on the tops of the opposite frames 24. Thus, each fastening member 50 is fixed on one corresponding fan 20. In this embodiment, the wedge-shaped extremity of each shaft 542 makes the shaft 542 easily engage in the corresponding through hole 240. The fan 20 with the fastening member 50 is received in the corresponding receiving space 19 of the receiving rack 10. The adjacent ends of two adjacent mounting members 30 corresponding to one receiving space 19 engage in two corresponding through holes 583 of a corresponding top sheet 580. The top of each first side plate 14 is received in the arches 540. Each protrusion 584 is latched in the latching slot 326 of a corresponding mounting member 30. Thereby, each fastening member 50 is tightly fastened in the four corresponding mounting members 30, and each fan 20 is tightly received in the receiving rack 10.

In use, the fan module is arranged on a bottom plate 202 of an electronic device 200. When the fans 20 operate at maximum, the mounting members 30 assist in absorbing vibrations.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

The invention claimed is:

1. A fan module comprising: a receiving rack comprising two opposite side plates, and defining a plurality of receiving spaces between the side plates, a top side of each side plate defines two cutouts communicating with a corresponding one of the plurality of receiving spaces; a plurality of mounting members each latched in a corresponding one of the cutouts of the receiving rack; a plurality of fans each received in a corresponding one of the receiving spaces of the receiving rack; and a plurality of fastening members arranged on the plurality of fans and latched to the mounting members, wherein each mounting member comprises a top surface, the top surface of each mounting member defines a latching slot, each fastening member comprises two opposite first pieces that bind an opening to accommodate a corresponding fan, a latching portion extends from an outer surface of each first piece to be latched in the latching slots of two adjacent mounting members of the corresponding receiving space.

2. The fan module of claim 1, wherein each mounting member further comprises a bottom surface connected between opposite ends of the top surface, the bottom surface defines a slot to receive a sidewall bounding each cutout.

3. The fan module of claim 2, wherein the sidewall bounding each cutout defines two opposite latching notches, two opposite protrusions extend from opposite ends of a wall of the slot to be latched in the corresponding latching notches.

4. The fan module of claim 2, wherein two opposite tabs extend from the sidewall bounding each cutout, above the corresponding latching notches, two opposite engaging portions extend from the ends of the top surfaces of each mounting member to engage with the corresponding tabs.

5. The fan module of claim 1, wherein each fan comprises opposite frames each defining two through holes in two top corners, two shafts extend from opposite ends of an inner surface of each first piece to be received in the through holes of the corresponding frame.

6. The fan module of claim 5, wherein an extremity of each shaft is substantially wedge-shaped.

7. The fan module of claim 1, wherein the latching portion comprises a top sheet extending from the outer surface of the corresponding first piece, two opposite latching blocks extending from opposite ends of the top sheet, and two protrusions extending from bottoms of the latching blocks to be accommodated in the corresponding latching slots.

8. The fan module of claim 7, wherein the top sheet defines two spaced through holes through which two adjacent ends of two adjacent mounting members of the corresponding receiving space extend.

9. The fan module of claim 1, wherein the receiving rack further comprises a bottom plate substantially perpendicularly connected between bottoms of the side plates, two opposite end plates substantially perpendicularly connected between corresponding ends of the side plates, and a plurality of dividing plates substantially perpendicularly connected between the first side plates and parallel to the end plates, thereby the dividing plates dividing the receiving rack into the plurality of receiving spaces.

10. The fan module of claim 1, wherein each mounting member is substantially C-shaped and made of elastic material, and each cutout of the receiving rack is substantially C-shaped.

11. A fan module comprising:
a receiving rack comprising two opposite side plates, and defining a plurality of receiving spaces between the side plates, a top side of each side plate defines two cutouts communicating with a corresponding one of the plurality of receiving spaces;
a plurality of mounting members each latched in a corresponding one of the cutouts of the receiving rack;
a plurality of fans each received in a corresponding one of the receiving spaces of the receiving rack; and
a plurality of fastening members arranged on the plurality of fans and latched to the mounting members,
wherein each mounting member comprises a top surface, the top surface of each mounting member defines a latching slot, two fastening members are arranged on each fan, opposite ends of each fastening member extend through opposite ends of each fan to engage in the corresponding latching slots, the fan comprises two opposite frames each defining two through holes in two top corners, each fastening member comprises a substantially arc-shaped elastic portion and two shafts extending from opposite ends of the elastic portion, the shafts extend through opposite through holes of the opposite frames to engage in the corresponding latching slots.

12. The fan module of claim 11, wherein each mounting member further comprises a bottom surface connected between opposite ends of the top surface, the bottom surface defines a slot to receive a sidewall bounding each cutout.

13. The fan module of claim 12, wherein the sidewall bounding each cutout defines two opposite latching notches, two opposite protrusions extend from opposite ends of a wall of the slot to be latched in the corresponding latching notches.

14. The fan module of claim 12, wherein two opposite tabs extend from the sidewall bounding each cutout, above the corresponding latching notches, two opposite engaging portions extend from the ends of the top surfaces of each mounting member to engage with the corresponding tabs.

15. The fan module of claim 11, wherein the receiving rack further comprises a bottom plate substantially perpendicularly connected between bottoms of the side plates, two opposite end plates substantially perpendicularly connected between corresponding ends of the side plates, and a plurality of dividing plates substantially perpendicularly connected between the side plates and parallel to the end plates, thereby the dividing plates dividing the receiving rack into the plurality of receiving spaces.

16. The fan module of claim 11, wherein each mounting member is substantially C-shaped and made of elastic material, and each cutout of the receiving rack is substantially C-shaped.

* * * * *